US010693021B2

(12) United States Patent
Kärkkäinen et al.

(10) Patent No.: US 10,693,021 B2
(45) Date of Patent: Jun. 23, 2020

(54) METHOD OF PASSIVATING A SILICON SUBSTRATE FOR USE IN A PHOTOVOLTAIC DEVICE

(71) Applicant: Optitune Oy, Oulu (FI)

(72) Inventors: Ari Kärkkäinen, Singapore (SG); Milja Hannu-Kuure, Oulu (FI); Henna Järvitalo, Oulu (FI); Paul Williams, Singapore (SG); Jarkko Leivo, Oulu (FI); Admir Hadzic, Oulu (FI); Jianhui Wang, Singapore (SG)

(73) Assignee: OPTITUNE OY, Oulu (FI)

( * ) Notice: Subject to any disclaimer, the term of this patent is extended or adjusted under 35 U.S.C. 154(b) by 0 days.

(21) Appl. No.: 14/430,556

(22) PCT Filed: Sep. 24, 2013

(86) PCT No.: PCT/FI2013/050925
§ 371 (c)(1),
(2) Date: Mar. 24, 2015

(87) PCT Pub. No.: WO2014/044923
PCT Pub. Date: Mar. 7, 2014

(65) Prior Publication Data
US 2015/0280020 A1    Oct. 1, 2015

Related U.S. Application Data

(60) Provisional application No. 61/704,756, filed on Sep. 24, 2012.

(30) Foreign Application Priority Data

Sep. 24, 2012    (FI) .................................... 20125987

(51) Int. Cl.
*H01L 31/0216*    (2014.01)
*H01L 31/18*    (2006.01)
(Continued)

(52) U.S. Cl.
CPC ...... *H01L 31/02168* (2013.01); *H01L 31/068* (2013.01); *H01L 31/1804* (2013.01);
(Continued)

(58) Field of Classification Search
CPC ....... A61B 5/04; A61B 5/6846; A61B 5/6851; A61B 2562/125; H01B 3/307;
(Continued)

(56) References Cited

U.S. PATENT DOCUMENTS 4,151,005 A * 4/1979 Strebkov ........... H01L 31/02167
136/246
6,465,799 B1 * 10/2002 Kimble ..................... A61L 2/10
250/455.11

(Continued)

FOREIGN PATENT DOCUMENTS

DE    102010016122 A1    9/2011
JP    2004006565 A    1/2004

*Primary Examiner* — Shaun M Campbell
(74) *Attorney, Agent, or Firm* — McCormick, Paulding & Huber PLLC

(57) ABSTRACT

A method of passivating a silicon substrate for use in a photovoltaic device, comprising providing a silicon substrate having a bulk and exhibiting a front surface and a rear surface, and forming by liquid phase application a dielectric layer on at least said rear surface. The dielectric layer formed at the rear surface is capable of acting as a reflector to enhance reflection of light into the bulk of the silicon substrate, and the dielectric layer is capable of releasing hydrogen into the bulk as well as onto a surface of the silicon substrate in order to provide hydrogenation and passivation. The present invention provides an inexpensive, low cost method of improving the electrical and/or optical performance of photovoltaic devices through the application of coating chemicals onto the backside of the silicon substrate.

11 Claims, 2 Drawing Sheets

(51) Int. Cl.
*H01L 31/068* (2012.01)
*C08L 83/04* (2006.01)

(52) U.S. Cl.
CPC .......... *H01L 31/1868* (2013.01); *C08L 83/04* (2013.01); *Y02E 10/547* (2013.01); *Y02P 70/521* (2015.11)

(58) Field of Classification Search
CPC ........ H01B 1/128; H01B 7/048; H01B 1/127; B21F 19/00; A61N 1/05; C08G 2261/51; C08G 2261/79; C08G 2261/70; H01L 31/02168; H01L 31/1804; H01L 31/1868; H01L 31/068; H01L 51/0037; Y02E 10/547; Y02P 70/521; C08L 83/04
USPC .......................................................... 438/65
See application file for complete search history.

(56) References Cited

U.S. PATENT DOCUMENTS

| | | | |
|---|---|---|---|
| 8,906,711 B2* | 12/2014 | Mohammadi | B82Y 30/00 252/519.12 |
| 9,773,991 B2* | 9/2017 | Martinson | H01L 51/448 |
| 2003/0071583 A1* | 4/2003 | Shimomura | H01J 65/048 315/248 |
| 2005/0221628 A1* | 10/2005 | Tanaka | H01L 29/2003 438/791 |
| 2007/0129473 A1* | 6/2007 | Shin | H01L 51/052 524/261 |
| 2010/0252103 A1* | 10/2010 | Yao | H01L 25/0756 136/256 |
| 2010/0263725 A1 | 10/2010 | Schmidt | |
| 2011/0034032 A1* | 2/2011 | Itoh | C23C 4/11 438/758 |
| 2011/0146787 A1 | 6/2011 | Allen et al. | |
| 2011/0156221 A1 | 6/2011 | Rode et al. | |
| 2012/0100474 A1* | 4/2012 | Hikosaka | C08G 64/10 430/69 |
| 2012/0192943 A1* | 8/2012 | Vermang | H01L 31/02167 136/256 |
| 2015/0295196 A1* | 10/2015 | Karkkainen | H01L 31/1868 136/256 |

* cited by examiner

METHOD OF PASSIVATING A SILICON SUBSTRATE FOR USE IN A PHOTOVOLTAIC DEVICE

TECHNICAL FIELD

This invention relates to hybrid and inorganic chemicals, applied in combination with surface treatments, process, methods of delivery and activation of the chemistry and surface resulting in higher photo-generated minority carrier lifetime, improved internal reflection at Near Infrared (NIR) range, and subsequent efficiency of the solar device.

BACKGROUND ART

The manufacturers of photovoltaic devices (PV), commonly referred to as solar cells, have historically been made from high purity single crystal, lattice matched semiconductor alloys where, due to the absence of dislocations, very few traps were encountered by free electrons generated in the photo voltaic process. The only traps existed at the surface between the device and air. These traps were generated by the surface configuration of the dangling bonds. These occurred as the three dimensional crystallographic nature of the atoms terminated at the air/crystal interface.

To reduce or eliminate these traps, manufacturers used additional thin layers on the front and/or back surfaces. These additional layers would have excellent passivating characteristics to the device structure removing the traps from the device. The passivating layers reduce the carrier recombination at silicon surfaces and therefore result in higher open-circuit voltage, which becomes increasingly important for high-performing solar cells. If applied on the front surface of the solar cells, the passivating layers can act as anti-reflective coatings (ARC).

On the other hand, when the coating layers are applied at the backside of solar cells, the optical parameters of this additional layer could be designed in such a way to improve the internal reflectivity in the device to enhance the light absorption by the device, and as a consequence, increase the efficiency of the device. Traditional surface passivation materials include SiOx, SiNx and etc which are usually prepared using vacuum techniques, such as, thermal oxidation, PECVD, or sputtering. Recently, AlOx draws more attention both academically and in industry. It has been demonstrated that amorphous AlOx films prepared by Atomic Layer Deposition (ALD) or Plasma Enhanced Chemical Vapor Deposition (PECVD) yield an excellent level of surface passivation on c-Si. However, due to the complexity of the PECVD and other processes, and the relatively high cost of the manufacturing tools and consumable chemicals and gases (eg. Trimethylaluminium or TMA), it is of great importance to develop alternative solutions to form dielectric coatings for silicon wafer solar cells. Liquid phase deposition is such a competitive approach which is of comparable passivation quality, cost-effective, and environmental friendly. With that, coatings prepared under atmospheric conditions are possible by eliminating those complex and expensive manufacturing tools.

The present invention aims at providing methods of modifying silicon solar substrates by liquid phase deposition while avoiding the use of hazardous chemicals and conditions.

SUMMARY OF THE INVENTION

The invention is based on the concept of liquid phase deposition of suitable chemical compositions to provide backside hydrogen release and passivation layer layers for crystalline, in particular p-type crystalline, silicon solar cells Thus, in the invention, a chemical composition is deposited onto the rear surface of a PV device to form a thin dielectric layer or layers of thickness ranging from 5 to 250 nm. The formed layer acts as a back reflector to enhance the reflection of light, especially at the NIR range, into bulk silicon. In addition, upon treating the chemical it is activated and introduces hydrogen into the bulk as well as onto the surface of the PV device.

Based on the above, the present method of hydrogen release and passivation a silicon substrate for use in a photovoltaic device, comprising the steps of
  providing a silicon substrate having a bulk and exhibiting a front surface and a rear surface; and
  forming by liquid phase application a dielectric layer on at least said rear surface.

The dielectric layer formed at the rear surface is capable of acting as a reflector to enhance reflection of light into the bulk of the silicon substrate. The dielectric layer is capable of releasing hydrogen into the bulk as well as onto a surface of the silicon substrate in order to provide hydrogenation and passivation.

ADVANTAGEOUS EFFECTS OF INVENTION

Considerable advantages are obtained by the present invention. Thus, the present invention provides an inexpensive, low cost method of improving the electrical and/or optical performance of photovoltaic devices through the application of coating chemicals onto the backside of the silicon substrate. An increase of the efficiency of the current extraction and a reduction of recombination occur within the device. This results in greater power output from the device.

The present procedure offers an alternative to the existing ALD or PECVD method using TMA, $SiH_4$ and other gases, enabling the PV manufacturers to apply chemicals rather than work with hazardous gases to produce a series of layers that provide passivation as well as light internal reflectance. The present finding provides, in the case of thick film solar cell production, to have the whole manufacturing sequence performed using chemicals applied under atmospheric conditions and without the use of any hazardous gas or PECVD with the additional benefit of cost reduction and better process control and equipment sustainability.

DETAILED DESCRIPTION

Figure 1:
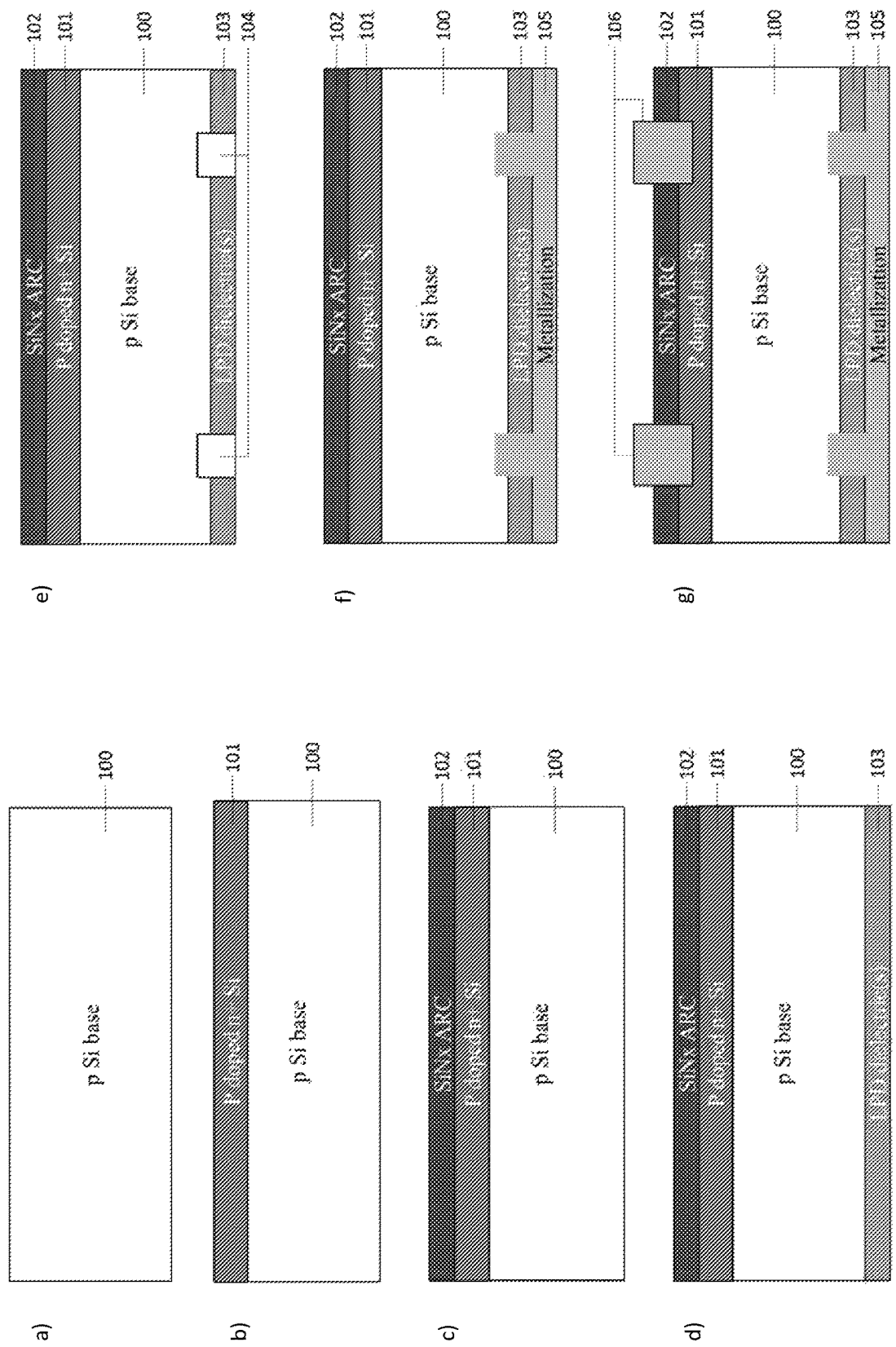
FIG. 1 is a schematic representation of a process flow for a p-type crystalline silicon solar cell fabrication with deposition of the chemical onto the back surface of the PV device without $Al_2O_3$ deposited by PECVD, ALD, or sputtering.

The method according to the present technology relates to the use of liquid phase processable chemical compositions which are capable of forming a hydrogen releasing and passivating, typically dielectric layer on a substrate particularly in a solar cell manufacturing process. Examples of such materials are siloxanes and metal-oxide polymer materials, although other materials also fall within the present technology.

In one embodiment, the invention relates to materials which have suitable properties for use as passivation, hydrogenation, and reflecting dielectric coatings applied at the backside of crystalline silicon solar cells. One embodiment of the invention is comprised of a method of applying these materials in crystalline silicon solar cell device fabrication. Another embodiment comprises a method of producing such coating material compositions. The passivating, hydrogenating, reflective materials comprise either single or hybrid oxide compositions which can be deposited onto silicon surface by means of an atmospheric liquid phase chemical coating method. Furthermore, the coatings are applied as single or multiple layers on the silicon substrate using one or more different formulations or compositions to deposit each layer.

Based on the above, in a method of passivating a silicon substrate, suitable for use in for example photovoltaic (PV) devices, a silicon substrate is provided with or without a layer of vacuum coated $Al_2O_3$ of a thickness ranging from 3 to 30 nm. The aluminium oxide layer can be produced for example by PECVD, sputter, or ALD. Further the substrate is provided with a passivating and/or reflecting layer thereon deposited from liquid phase. The passivating layer comprises in one embodiment a silicon carbide or a silicon oxide material or a combination thereof for passivating a silicon surface (e.g. an n type silicon surface), or an aluminium oxide, or aluminium oxide and silicon oxide hybrid, with or without a titanium oxide cap, for passivating p type silicon surface. The passivating layer further comprises hydrogen which it is capable of releasing so that the passivating layer causes a reduction in the surface and bulk recombination velocity of the silicon substrate.

Accordingly, a preferred embodiment comprises additionally forming at the rear surface a layer of $Al_2O_3$ having a thickness in the range from 1 to 50 nm, in particular 3 to 30 nm, said layer preferably being formed by plasma-enhanced CVD, by sputtering, or by atomic layer deposition. The $Al_2O_3$ layer is preferably formed under the hydrogen-releasing layer, between the hydrogen releasing and passivating layer and the rear surface of the substrate.

A dielectric, hydrogen releasing and optionally anti-reflecting layer is formed by liquid phase deposition also on the front surface of the silicon substrate. Such a layer will also act as an ARC layer.

In a preferred embodiment, the surface recombination velocity of the silicon substrate is less than 100 cm/sec after the indicated modification.

The hydrogen release and passivation layer comprises oxygen, silicon, hydrogen and aluminium and/or titanium for p-type silicon surface and act as capping layer for $Al_2O_3$ deposited by PECVD, ALD, or sputtering. In addition to working as a capping layer the hydrogen release and passivation layer improves reflection and further improves passivation.

The passivating layer comprises silicon, oxygen and hydrogen for an n type silicon substrate. It can also comprise silicon, carbon and hydrogen for an n type silicon substrate, or silicon, carbon, oxygen and hydrogen for an n type silicon substrate.

The passivating layer comprises aluminium, oxygen, and hydrogen for a p type silicon substrate, or titanium, oxygen, and hydrogen for a p type silicon substrate, or aluminium, titanium, oxygen, and hydrogen for p type silicon substrate.

In an embodiment, wherein the functional layer comprises a siloxane or metal oxide coating material, the molecular weight of that polymer or material is in the range of 400 to 150,000, preferably about 500 to 100,000, in particular about 750 to 50,000 g/mol.

The silicon substrate, such as silicon wafer, is part of a photovoltaic cell. The photovoltaic cell can be, and preferably is, a part of a photovoltaic panel/module.

In one embodiment, the photovoltaic cell array is laminated with cover glass with a thickness ranging from 1 mm to 4 mm. The photovoltaic cell array can be laminated with cover glass that is anti-reflection coated to further improve the efficiency of the photovoltaic cell.

In a particularly advantageous embodiment, the photovoltaic cell is manufactured using only atmospheric manufacturing processes (i.e. the various layers are formed by liquid phase deposition process, preferably carried out in atmospheric conditions).

In respect to the above discussion on hydrogenation and passivation, it should be pointed out that positively charged SiOx is well suitable for passivation for the emitter (sunny side) of p-type solar cell and for the back side of n-type solar cell due to the formation of accumulation layer through surface band-bending. Hydrogenation from SiOx further reduces both surface and bulk recombination velocity through chemical passivation of defects, which ties up the dangling bonds and reduces Dit (density of interface states).

Aluminium oxide is a highly negatively charged dielectric which provides excellent passivation for the back side of p-type solar cell or for the front side of n-type solar cell by forming an accumulation layer by surface field effect (band-bending).

With AlOx deposited on the back side of p-type solar cell, improved passivation is achieved compared to Al-BSF, while avoiding the parasitic shunting that would occur from using positively charged SiOx or SiNx.

Figure 2:
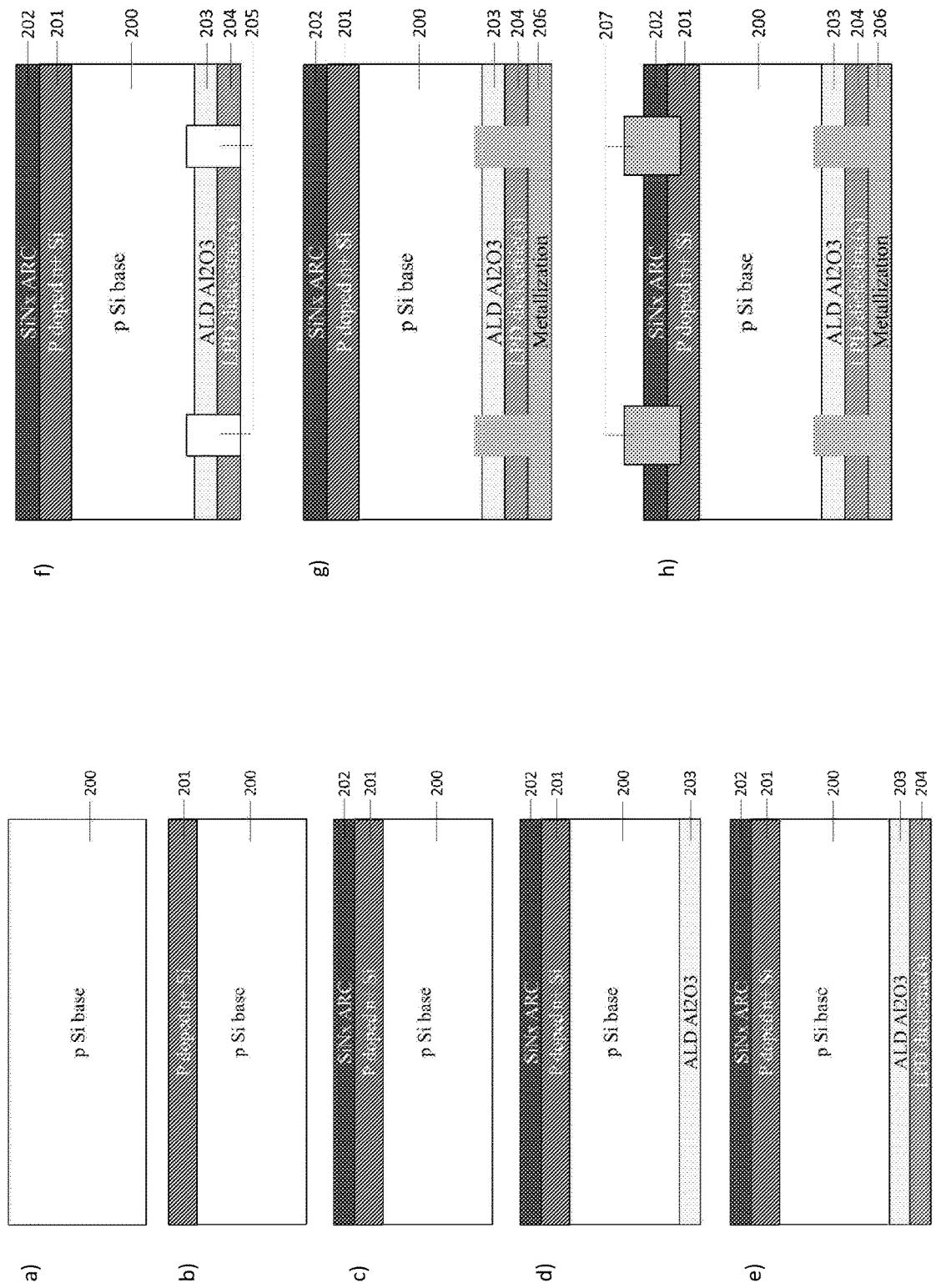
FIG. 2 is a schematic representing a process flow for a p-type crystalline silicon solar cell fabrication with deposition of the chemical onto the back surface of the PV device with $Al_2O_3$ deposited by PECVD, ALD, or sputtering.

FIGS. 1 and 2 illustrate proposed steps to fabricate silicon wafer solar cell incorporating liquid phase deposited dielectrics at the back surface of the device.

Referring to FIG. 1*a* to 1*g*, it can be noted that they contain cross sectional views showing the process flow for manufacturing a p-type crystalline silicon solar cell incorporating therein dielectric(s) in accordance with a preferred embodiment of the present invention in absence of ALD $Al_2O_3$.

The process for fabricating the silicon solar cell begins with a boron doped p-type silicon substrate 100 which is saw-damage etched, textured and cleaned using wet chemicals. The substrate 100 undergoes either batch or inline doping and diffusion with phosphorous bearing chemical source, which results into a negative phosphorous doped region 101. The doped region 101 could also be achieved with other doping techniques, such as ion implantation. Phosphorus silica glass (PSG) formed during diffusion is removed prior to the SiNx anti-reflection coating (ARC) 102 deposited by PECVD, sputtering or other methods. Edge isolation of the solar cell could either be accomplished before SiNx ARC deposition or after metallization at later stage.

The dielectric(s) 103 i.e., aluminium oxide and/or titanium oxide or similar which contains releasable hydrogen, is/are coated at the back of the solar cell with liquid phase deposition. The dielectrics 103 can be deposited by using any wet chemical process methods including (but not limited to) spray coating, roller coating, ink-jet, dip coating, spin coating, slot coating. The dielectric 103 can be deposited as a full area film or alternatively can be deposited or processed to form a pattern on the silicon wafer surface.

Following this, contact opening 104 at the back could be achieved by laser ablation, inkjet printing, or photo masking. The pattern of the contacts can be either lines or holes with total opening to total surface ratio ranging from 1 to 10%. Metallization at the back 105 is done with screen print, inkjet printing, direct printing, sputtering, or evaporation. Front metal grids 106 are made using screen print, inkjet print, direct print, sputtering, evaporation or electro-plating combined with front dielectric opening. A final step of co-firing is required to form back surface field (BSF) in case of Al used, and to fire through the contact at the front. Choices of material for metal 105 can be aluminium (Al), silver (Ag), or copper (Cu). Choices of material for metal 106 can be silver (Ag) or copper (Cu).

As an example of a solar cell fabricated using the method described in FIG. 1, a boron doped p-type float zone (FZ) mono-crystalline silicon wafer of (100) orientation is used as the substrate for solar cell device. Thickness of the substrate is below 250 μm. The bulk resistivity of the silicon wafer is 0.5-2.5 Ω·cm. Silicon wafer is saw damage etched, and alkaline textured at one side with pyramid size of 1-10 μm. Textured wafer undergoes $POCl_3$ diffusion to form an emitter of sheet resistance at 50-100Ω/□. Typical diffusion temperature is 750-950° C. Parasitic PSG and junction formed at the back surface during diffusion are removed using mixture of nitric acid (HNO3) and hydrofluoric acid (HF). A layer of silicon nitride (SiNx) in the range of 60-100 nm is deposited at the sunny side as anti-reflection and passivation coating, after which a layer of 80-150 nm aluminium oxide is coated at the back by spray coating process. The refractive index of SiNx is from 1.90 to 2.20 at wavelength of 633 nm, and that of liquid phase coated aluminium oxide is from 1.55 to 1.75 at the wavelength of 633 nm. The thickness and refractive index of aluminium oxide are selected in the described ranges in order to achieve excellent surface passivation and internal reflection. After dielectric coating at the front and back sides of the solar cell, the device is laser ablated at the back to open a series of holes with total opening fraction of 1-10%. A wide range of laser sources, such as femtosecond, picosecond, and nanosecond ones, can be chosen for the purpose. Laser power is controlled at this step to fully open the dielectric at the locations of interest, but also to minimize the damage on the silicon substrate underneath. A layer of aluminium paste is screen printed and dried at the back surface of the solar device. The thickness of the aluminium paste is chosen from 10-50 μm to ensure a maximum amount of local BSF formation at later stage, and minimum level of wafer warpage on the other hand. Silver grids and busbars are then screen printed and dried to form the metal contacts. In the final step, a belt firing furnace is used to fire the silver fingers through the SiNx coating, form the locat Al-BSF, and enhance surface and bulk hydrogenation. The peak temperature of the firing step is from 700-900° C. With the back passivation material and method described, surface recombination velocity (SRV)<90 cm/s can be achieved for 1.5 Ω·cm p-type silicon, in comparison to typical SRV value of 500-1000 cm/s for silicon surface passivated with full Al-BSF.

Referring to FIGS. 2a to 2h, there can be seen cross sectional views showing the process flow for manufacturing a crystalline silicon solar cell incorporating therein dielectric(s) in accordance with a preferred embodiment of the present invention in presence of ALD $Al_2O_3$.

The process for fabricating the silicon solar cell begins with a boron doped p-type silicon substrate 200 which is saw-damage etched, textured and cleaned using wet chemicals. The substrate 200 undergoes either batch or inline doping and diffusion with phosphorous bearing chemical source, which results into a negative phosphorous doped region 201. The doped region 201 could also be achieved with other doping techniques, such as ion implantation. Phosphorus silica glass (PSG) formed during diffusion is removed prior to the SiNx anti-reflection coating (ARC) 202 deposited by PECVD, sputtering or other methods. Edge isolation of the solar cell could either be accomplished before SiNx ARC deposition or after metallization at later stage. A thin layer of $Al_2O_3$ 203 of thickness from 3 to 30 nm is deposited by atomic layer deposition (ALD) technique.

The dielectric(s) 204 i.e., silane, aluminium oxide and/or titanium oxide containing releasable hydrogen, is/are coated at the back of the solar cell with liquid phase deposition. The dielectrics 204 can be deposited by using any wet chemical process methods including (but not limited to) spray coating, roller coating, ink-jet, dip coating, spin coating, slot coating. The dielectric 204 can be deposited as a full area film or alternatively can be deposited or processed to form a pattern on the silicon wafer surface.

Following this, contact opening 205 at the back could be achieved by laser ablation, inkjet printing, or photo masking. The pattern of the contacts can be either lines or holes with total opening to total surface ratio ranging from 1 to 10%. Metallization at the back 206 is done with screen print, inkjet printing, direct printing, sputtering, or evaporation. Front metal grids 207 are made using screen print, inkjet print, direct print, sputtering, evaporation or electro-plating combined with front dielectric opening. A final step of co-firing is required to form back surface field (BSF) in case of Al used, and to fire through the contact at the front. Choices of material for metal 206 can be aluminium (Al), silver (Ag), or copper (Cu). Choices of material for metal 207 can be silver (Ag) or copper (Cu).

As an example of a solar cell fabricated using the method described in FIG. 2, a boron doped p-type float zone (FZ) mono-crystalline silicon wafer of (100) orientation is used as the substrate for solar cell device. Thickness of the substrate is below 250 μm. The bulk resistivity of the silicon wafer is 0.5-2.5 Ω·cm. Silicon wafer is saw damage etched, and alkaline textured at one side with pyramid size of 1-10 μm. Textured wafer undergoes POCl3 diffusion to form an emitter of sheet resistance at 50-100Ω/□. Typical diffusion temperature is 750-950° C. Parasitic PSG and junction formed at the back surface during diffusion are removed using mixture of nitric acid (HNO3) and hydrofluoric acid (HF). A layer of silicon nitride (SiNx) in the range of 60-100 nm is deposited at the sunny side as anti-reflection and passivation coating, after which a layer of ALD aluminium oxide (Al2O3) is deposited at the back of the solar device. The thickness of the ALD aluminium oxide is 5-30 nm, and its refractive index is 1.50 to 1.80 at the wavelength of 633 nm. A liquid phase deposited hybrid aluminium oxide, containing releasable hydrogen, ranging from 80 to 150 nm is coated on the top of ALD Al2O3. The refractive index of SiNx is from 1.90 to 2.20 at the wavelength of 633 nm, and that of liquid phase coated hybrid aluminium oxide, containing releasable hydrogen, is from 1.50 to 1.80 at the wavelength of 633 nm. The thickness and refractive index of LPD Al2O3 are selected in the described ranges in order to achieve excellent surface passivation and internal reflection. After dielectric coating at the front and back sides of the solar cell, the device is laser ablated at the back to open a series of holes with total opening fraction of 1-10%. A wide range of laser sources, such as femtosecond, picosecond, and nanosecond ones, can be chosen for the purpose. Laser power is controlled at this step to fully open the dielectric at the locations of interest, but also to minimize the damage on the silicon substrate underneath. A layer of aluminium paste is screen printed and dried at the back surface of the solar device. The thickness of the aluminium paste is chosen from 10-50 μm to ensure a maximum amount of local BSF formation at later stage, and minimum level of wafer warpage on the other hand. Silver grids and busbars are then screen printed and dried to form the metal contacts. In the final step, a belt firing furnace is used to fire the silver fingers through the SiNx coating, form the locat Al-BSF, and enhance surface and bulk hydrogenation. The peak temperature of the firing step is from 700-900° C. With the back passivation material and method described, surface recombination velocity (SRV) as low as <20 cm/s has been achieved for 1.5 Ω·cm p-type silicon, in comparison to typical SRV value of 500-1000 cm/s for silicon surface passivated with full Al-BSF. Rear reflection at near infrared wavelength range is improved by up to abs. 35% in comparison to solar cell with screen printed Al-BSF.

All typical process parameters are listed in Table 1.

Table 1 lists process parameters for passivated emitter and rear cell (PERC) using LPD passivating dielectric at the back compared to full Al-BSF

| Substrate material | Full Al-BSF p-type (100) FZ, 1.5 Ω · cm | LPD PERC p-type (100) FZ, 1.5 Ω · cm | LPD + ALD PERC p-type (100) FZ, 1.5 Ω · cm |
| --- | --- | --- | --- |
| Wafer thickness, μm | 200 | 200 | 200 |
| Emitter Rsh, Ω/☐ | 70 | 70 | 70 |
| SiNx thickness, nm | 75 | 75 | 75 |
| SiNx RI @ 633 nm | 2.0 | 2.0 | 2.0 |
| ALD Al2O3 thickness, nm | NA | NA | 15 |
| ALD Al2O3 RI @ 633nm | NA | NA | 1.60 |
| LPD Al2O3 thickness, nm | NA | 100 | 100 |
| LPD Al2O3 RI @ 633 nm | NA | 1.50 | 1.50 |
| Rear SRV, cm/s | 1000 | <90 | <20 |
| Rear reflection, % | 65 | 90 | 90 |

In a preferred embodiment, the functional layers, which also can be called hydrogen releasing and passivating layers, are formed from siloxane/silane polymers, hybrid organic-inorganic polymers or carbosilane polymers. The polymers can be produced from various intermediates, precursors and monomers.

Furthermore, the above mentioned polymers contain at least one monomer, precursor or polymer that has a group or a substituent or a part of the molecules that has a hydrogen atom, and which capable of releasing that hydrogen atom, in particular in subsequent processing steps of the functional layer in solar cell manufacturing process. The hydrogen releasing monomer can be a silane precursor, for example trimethoxysilane, triethoxysilane (generally any trialkoxysilane, wherein alkoxy has 1 to 8 carbon atoms), a trihalosilane, such as trichlorosilane, or similar silanes, in particular of the kind which contain at least one hydrogen after hydrolysis and condensation polymerization. It can be used as monomeric additive in the coating material or hydrolyzed and condensed as part of the material backbone matrix. Also other silane types can be used as hydrogen releasing entities, including bi-silanes, and carbosilanes which contain hydrogen moiety. Generally, it is required that the hydrogen releasing group or substituent or part of the molecule contains a hydrogen which is bonded to a metal or a semimetal atom, preferably to a metal or a semimetal atom in the polymeric structure forming the layer. The hydrogen can also be bonded to a carbon atom, provided that the hydrogen is released upon treatment of the functional layers.

Hybrid organic-inorganic polymers can be synthesized by using silane or metal (or semimetal) oxide monomers or, and in particular, combinations of silane and metal oxide monomers as starting materials. Furthermore, the final coating chemical (precursor, monomer, polymer, intermediate, catalyst or solvent) has hydrogen moiety in the composition and that hydrogen being able to be released then during the solar cell manufacturing process to provide hydrogenation and passivation qualities. The polymers and intermediates have a siloxane backbone comprising repeating units of —Si—C—Si—O and/or —Si—O— and/or —Si—C—Si—C. Generally, in the formula (—Si—O—)$_n$ and in the formula (—Si—C—Si—O—)$_n$ and in the formulas (—Si—C—)$_n$ the symbol n stands for an integer 4 to 10,000, in particular about 10 to 5000. In the case of using hybrid silane and metal oxide monomers the polymer and intermediates have a backbone comprising repeating units —Si—O—Me—O (where Me indicates metal atom such as Ti, Ta, Al or similar). The hybrid silane-metal oxide backbone can be also different to this.

Hybrid organic-inorganic polycondensates can be synthesized by using metal alkoxides and/or metal salts as metal precursors. Metal precursors are first hydrolysed, and metal alkoxides are typically used as the main source for the metal precursors. Due to the different hydrolysis rate, the metal alkoxides must be first hydrolysed and then chelated or otherwise inactivated in order to prevent self-condensation into monocondensate Me—O—Me precipitates. In the presence of water, this can be controlled by controlling the pH, which controls the complex ions formation and their coordination. For example, aluminum can typically form four-fold coordinated complex-ions in alkaline conditions and six-fold coordinated complex-ions in acidic conditions. By using metal salts as co-precursors, such as nitrates, chlorides, sulfates, and so on, their counter-ions and their hydrolysable metal complex-ions can conduct the formation of different coordination states into the final metal precursor hydrolysate.

Once a hydrolysed metal precursor is achieved, the next step is to introduce the silica species into the chelated or inactivated metal precursor solution. Silica sources are first dissolved and hydrolysed, at least partially, either directly in the metal precursor solution or before its introduction into the metal precursor solution. During or after the introduction, the partially or fully hydrolysed silica species are then let to react with the metal hydrolysate to form a polycondensate. The reaction can be catalyzed by altering the temperature, concentration, temperature, and so on, and it typically occurs at higher temperatures than room temperature. Due to the nature of metal complex-ions in general, it is often common that the polycondensates resembles rather a nanoparticulate structure than a linear polymer, which therefore has to be further electrochemically or colloidally stabilized to sustain its nanosized measures in the coating solution. During processing, the solution further forms a coating that will have its final degree of condensation after heat-treatment, where the major part of rest of the hydrolyzed groups are removed.

Again for example triethoxysilane (or another one of the above mentioned monomers) can be used as the hydrogen releasing moiety in the material. The Triethoxysilane is hydrolyzed and condensation polymerized example with the metal (semimetal) alkokside to results in final product. It is also possible to make the synthesis from halogenide based precursor and other types as well.

In the polymeric structures disclosed above, there is preferably a releasable hydrogen directly bonded to a metal or semimetal atom.

There can be up to one releasable hydrogen attached to each repeating metal or semimetal atom of the backbone.

The precursor molecules of the siloxane and/or metal (semimetal) oxide polymers can be penta-, tetra-, tri-, di-, or mono-functional molecules. A penta-functional molecule has five hydrolysable groups; tetra-functional molecule has four hydrolysable groups; a tri-functional molecule has three hydrolysable groups; a di-functional molecule has two; and mono-functional molecule has one. The precursor molecules, i.e. silane and metal oxide monomers can be have organic functionalities. The precursor molecules can be also bi-silanes and especially in case of some metal oxide or hybrid metal oxide it is possible to use some stabilizing agents in the composition in addition to other additives and catalyst. The molecular weight range for the siloxane and/or metal oxide coating material is in range of 400 to 150,000, preferably about 500 to 100,000, in particular about 750 to 50,000 g/mol.

A wet chemical coating is prepared from the coating solution by any typical liquid application (coating) processes, preferably with spin-on, dip, spray, ink-jet, roll-to-roll, gravure, flexo-graphic, curtain, drip, roller, screen printing coating methods, extrusion coating and slit coating, but are not limited to these.

According to one embodiment, the process according to the invention comprises hydrolyzing and polymerizing a monomers according to either or both of formulas I and II:

$$R^1_a SiX_{4-a} \qquad \qquad I$$

and $$R^2_b SiX_{4-b} \qquad \qquad II$$

wherein
R$^1$ and R$^2$ are independently selected from the group consisting of hydrogen, linear and branched alkyl and cycloalkyl, alkenyl, alkynyl, (alk)acrylate, epoxy, allyl, vinyl and alkoxy and aryl having 1 to 6 rings;
each X represents independently halogen, a hydrolysable group or a hydrocarbon residue; and
a and b is an integer 1 to 3.

Further, in combination with monomers of formula I or II or as such at least one monomer corresponding to Formula III can be employed:

$$R^3_c SiX_{4-c} \qquad \qquad III$$

wherein
R$^3$ stands for hydrogen, alkyl or cycloalkyl which optionally carries one or several substituents, or alkoxy;
each X represents independently halogen, a hydrolysable group or a hydrocarbon residue having the same meaning as above; and
c is an integer 1 to 3.

In any of the formulas above, the hydrolysable group is in particular an alkoxy group (cf. formula IV).

As discussed above, in the present invention organosiloxane polymers are produced using tri- or tetraalkoxysilane. The alkoxy groups of the silane can be identical or different and preferably selected from the group of radicals having the formula $$—O—R^4 \qquad \qquad IV$$

wherein R$^4$ stands for a linear or branched alkyl group having 1 to 10, preferably 1 to 6 carbon atoms, and optionally exhibiting one or two substituents selected from the group of halogen, hydroxyl, vinyl, epoxy and allyl.

The above precursor molecules are condensation polymerized to achieve the final siloxane polymer composition. Generally, in case of tri-, di- and mono-functional molecules, the other functional groups (depending on the number of hydrolysable group number) of the precursor molecules can be organic functionalities such as linear, aryl, cyclic, aliphatic groups. These organic groups can also contain reactive functional groups e.g. amine, epoxy, acryloxy, allyl or vinyl groups. These reactive organic groups can optionally react during the thermal or radiation initiated curing step. Thermal and radiation sensitive initiators can be used to achieve specific curing properties from the material composition.

According to a preferred embodiment, when using the above monomers, at least one of the monomers used for hydrolysation and condensation is selected from monomers having formulas I or II, wherein at least one substituent is a group capable of providing the hydrogenation and passivation characteristics for the coated film. For preparing the prepolymer, the molar portion of units derived from such monomers (or the molar portion of monomers containing the active group calculated from the total amount of monomers) is about 0.1 to 100%, preferably about 20%-100%, in particular about 30% to 100%. In some cases, the group will be present in a concentration of about 30% based on the molar portion of monomers.

In the above polymers, the relation (molar ratio) between monomers providing releasable hydrogens in the polymeric material and monomers which do not contain or provide such hydrogens is preferably 1:10, in particular 5:10, preferably 10:10-1000:10. It is possible even to employ only monomers leaving a releasable hydrogen for the production of the polymer.

The carbosilane polymer can be synthesized for example by using Grignard coupling of chloromethyltrichlorosilane in the presence THF followed by reduction with lithium aluminum hydride. A general reaction route is given below. The end product contains two hydrogens bonded to the silicon atom which are capable being released during the processing of the silicon solar cell. The final product is dissolved in a processing solvent and can be processed as is using the liquid phase deposition. The final product can be used also as dopant, additive or reacted with silane or metal (or semimetal) backbone to results as coating material.

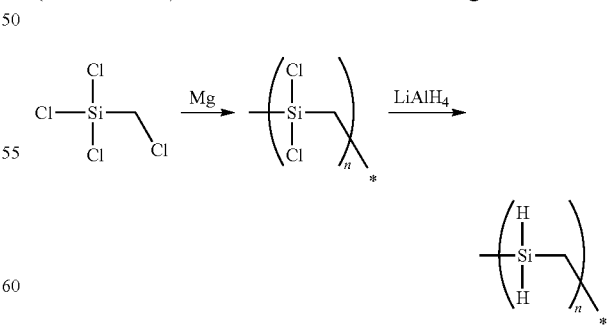

According to a preferred embodiment, when using the above monomers, at least one of the monomers used for hydrolysation and condensation is selected from monomers having formulas I or II, wherein at least one substituent is a group capable of providing the hydrogenation and passivation characteristics for the coated film. For preparing the prepolymer, the molar portion of units derived from such monomers (or the molar portion of monomers containing the active group calculated from the total amount of monomers) is about 0.1 to 100%, preferably about 20% to 100%, in particular about 30% to 100%. In some cases, the group will be present in a concentration of about 30% based on the molar portion of monomers.

According to one embodiment, at least 50 mol-% of the monomers are being selected from the group of tetraethoxysilane, triethoxysilane, tetramethoxysilane, trimethoxysilane, tetrachlorosilane, trichlorosilane, and mixtures thereof.

According to one embodiment, the solution coating polymer composition comprises a siloxane polymer, hybrid silane metal oxide polymer or carbosilane polymer in a solvent phase, wherein the partially cross-linked prepolymer has a siloxane or hybrid silane metal oxide or carbosilane backbone formed by repeating units and having a molecular weight in the range of from about 1,000 to about 15,000 g/mol, for example 2,000 to 10,000 g/mol. In addition, the (pre)polymer backbone exhibits 1 to 100 releasable hydrogen per 100 repeating units.

According to another embodiment, the siloxane composition comprises a siloxane polymer, hybrid silane metal oxide polymer or carbosilane polymer in a solvent phase, wherein
  the partially cross-linked prepolymer has a siloxane backbone formed by repeating —Si—O— units and having a molecular weight in the range of from about 4,000 to about 10,000 g/mol, the siloxane backbone exhibiting hydroxyl groups in an amount of about 5 to 70% of the —Si—O— units and further exhibiting epoxy groups in an amount of 1 to 15 mol %, calculated from the amount of repeating units; and
  the composition further comprises 0.1-3%, based on the weight of the solid matter, at least one cationic photo reactive compound.

The synthesis of the siloxane polymer is carried out in two steps. In the first synthesis step, in the following also called the hydrolysis step, the precursor molecules are hydrolyzed in presence typically of water and a catalyst, such as hydrochloric acid or nitric acid or another mineral or organic acid or a base, and in the second step, the polymerization step, the molecular weight of the material is increased by condensation polymerization or other crosslinking depending on what precursors are chosen to the synthesis. The water used in the hydrolysis step has typically a pH of less than 7, preferably less than 6, in particular less than 5.

It may be preferable in some cases to carry out the condensation polymerization in the presence of a suitable catalyst. In this step the molecular weight of the prepolymer is increased to facilitate suitable properties of the material and film deposition and processing.

The siloxane polymer synthesis, including the hydrolysis, the condensation and the cross-linking reactions, can be carried out using an inert solvent or inert solvent mixture, such as acetone or PGMEA, "non-inert solvent", such as alcohols, or without a solvent. The used solvent affects the final siloxane polymer composition. The reaction can be carried out in basic, neutral or acidic conditions in the presence of a catalyst. The hydrolysis of the precursors may be done in the presence of water (excess of water, stoichiometric amount of water or sub-stoichiometric amount of water). Heat may be applied during the reaction and refluxing can be used during the reaction.

Typically before the further condensation the excess of water is removed from the material and at this stage it is possible to make a solvent exchange to another synthesis solvent if desired. This other synthesis solvent may function as the final or one of the final processing solvents of the siloxane polymer. The residual water and alcohols and other by-products may be removed after the further condensation step is finalized. Additional processing solvent(s) may be added during the formulation step to form the final processing solvent combination. Additives such as thermal initiators, radiation sensitive initiators, surfactants and other additives may be added prior to final filtration of the siloxane polymer. After the formulation of the composition, the polymer is ready for processing.

Suitable solvents for the synthesis are, for example, acetone, tetrahydrofuran (THF), toluene, 1-propanol, 2-propanol, methanol, ethanol, propylene glycol monomethyl ether, propylene glycol propyl ether, methyl-tert-butylether (MTBE), propylene glycol monomethylether acetate (PGMEA), propylene glycol monomethylether PGME and propylene glycol propyl ether (PnP), PNB, IPA, MIBK, Glycol Ethers (Oxitols, Proxitols), Butyl Acetates, MEK Acetate, or mixtures of these solvents or other suitable solvents.

After synthesis, the material is diluted using a proper solvent or solvent combination to give a solid content and coating solution properties which with the selected film deposition method will yield the pre-selected film thickness. Suitable solvents for the formulation are example 1-propanol, 2-propanol, ethanol, propylene glycol monomethyl ether, propylene glycol propyl ether (PNP), PNB (propandiol-monobutyl ether), methyl-tert-butylether (MTBE), propylene glycol monomethylether acetate (PGMEA), propylene glycol monomethylether PGME and PNB, IPA, MIBK, Glycol Ethers (Oxitols, Proxitols), Butyl Acetates, MEK Acetate, or mixtures of these solvents or other suitable solvents.

The final coating film thickness has to be optimized according for each device and structure fabrication process. In addition to using different solvents it is also possible to use surfactants and other additives to improve the coating film quality, wetting and conformality on the silicon cell.

Optionally, an initiator or catalyst compound is added to the siloxane composition after synthesis. The initiator, which can be similar to the one added during polymerization, is used for creating a species that can initiate the polymerization of the "active" functional group in the UV curing step. Thus, in case of an epoxy group, cationic or anionic initiators can be used. In case of a group with double bonds as "active" functional group in the synthesized material, radical initiators can be employed. Also thermal initiators (working according to the radical, cationic or anionic mechanism) can be used to facilitate the cross-linking of the "active" functional groups. The choice of a proper combination of the photoinitiators also depends on the used exposure source (wavelength). Also photoacid generators and thermal acid generators can be used to facilitate improved film curing. The concentration of the photo or thermally reactive compound in the composition is generally about 0.1 to 10%, preferably about 0.5 to 5%, calculated from the mass of the siloxane polymer.

Film thicknesses may range e.g. from 1 nm to 500 nm. Various methods of producing thin films are described in U.S. Pat. No. 7,094,709, the contents of which are herewith incorporated by reference.

A film produced according to the invention typically has an index of refraction in the range from 1.2 to 2.4 at a wavelength of 633 nm.

The composition as described above may comprise solid nanoparticles in an amount between 1 and 50 wt-% of the composition. The nanoparticles are in particular selected from the group of light scattering pigments and inorganic phosphors or similar. By means of the invention, materials are provided which are suitable for producing films and patterned structures on silicon cells. The patterning of the thermally and/or irradiation sensitive material compositions can be performed via direct lithographic patterning, laser patterning and exposure, conventional lithographic masking and etching procedure, imprinting, ink-jet, screen-printing and embossing, but are not limited to these.

The compositions can be used for making layers which are cured at relatively low processing temperatures, e.g. at a temperature of max 375° C. or even at temperature of 100° C. and in the range between these limits.

However the coating layer formed from the material compositions can also be cured at higher temperatures, i.e. at temperatures over 375° C. and up to 900° C., or even up to 1100° C., making it possible for the material films or structures to be cured at a high temperature curing, such as can be combined with a subsequent high temperature deposition and firing steps.

In the following, there is presented a number of working examples giving further details of the preparation of the above-discussed siloxane polymer, hybrid silane-metal oxide polymer and carbosilane coating compositions, suitable for forming passivating and hydrogen-releasing layers on silicon substrates in photovoltaic devices. These materials can be applied as discussed above in connection with the drawings.

Example 1

Tetraethyl orthosilicate (28.00 g) and Triethoxysilane (42.00 g) and solvent (ethanol) were weighted into the 1 L flask and stirred for 30 minutes. 0.01 M HCl (2× equivalent) was added. Material was refluxed for one hour. Solvent exchange was done to propylene glycol propyl ether (PnP). A further condensation polymerization was carried out in presence of catalyst (triethylamine). After this trimethylmethoxysilane (0.02 g) was added and further solvent exchange done to propylene glycol propyl ether (PnP). Material was diluted to process formulation and filtrated with 0.1 μm filter to obtain process ready solution.

Example 2

Tetraethyl orthosilicate (14.00 g) and Triethoxysilane (60.00 g) and solvent (2-propanol) were weighted into the 1 L flask and stirred for 30 minutes. 0.01 M HCl (0.6 equivalent) was added. Material was refluxed for one hour. Solvent exchange was done to propandiol-monobutyl ether (PNB). A further condensation polymerization was carried out in presence of catalyst (triethylamine). After this trimethylmethoxysilane (0.021 g) was added and further solvent exchange done to propylene glycol propyl ether (PnP). Material was diluted to process formulation and filtrated with 0.1 μm filter to obtain process ready solution.

Example 3

Methyl-trimethoxysilane (15.00 g), 3-Glycidoxypropyl-trimethoxysilane (9.00 g) and Triethoxysilane (75.00 g) and solvent (2-propanol) were weighted into the 1 L flask and stirred for 30 minutes. 0.01 M HCl (1 equivalent) was added. Material was refluxed for one hour. Solvent exchange was done to propylene glycol propyl ether (PnP). A further condensation polymerization was carried out in presence of catalyst (triethylamine). After this trimethylethoxysilane (0.025 g) was added and further solvent exchange done to propylene glycol propyl ether (PnP). Material was diluted to process formulation and filtrated with 0.1 μm filter to obtain process ready solution.

Example 4

Tetraethyl orthosilicate (5.00 g) and Triethoxysilane (82.00 g) and solvent (2-propanol) were weighted into the 1 L flask and stirred for 30 minutes. 0.01 M HCl (1 equivalent) was added. Material was refluxed for one hour. Solvent exchange was done to propylene glycol propyl ether (PnP). A further condensation polymerization was carried out in presence of catalyst (triethylamine). After this trimethylethoxysilane (0.025 g) was added and further solvent exchange done to propylene glycol propyl ether (PnP). Material was diluted to process formulation and filtrated with 0.1 μm filter to obtain process ready solution.

Example 5

Triethoxysilane (98.00 g) and solvent (2-propanol) were weighted into the 1 L flask and stirred for 30 minutes. 0.01 M HCl (0.6 equivalent) was added. Material was refluxed for one hour. Solvent exchange was done to propylene glycol propyl ether (PnP). A further condensation polymerization was carried out in presence of catalyst (triethylamine). After this trimethylchlorosilane (0.02 g) was added and further solvent exchange done to propylene glycol propyl ether (PnP). Material was diluted to process formulation and filtrated with 0.1 μm filter to obtain process ready solution.

Example 6

Aluminium nitrate-nonahydrate (180 g) in water solution was mixed with Aluminium isopropoxide (80 g). After that triethoxysilane (15 g) was added. Solution was refluxed for 4 hours. 1-propanol was added as processing solvent and filtrated with 0.1 μm filter to obtain process ready solution.

Example 7

Aluminium nitrate-nonahydrate (180 g) in water solution was mixed with Aluminium isopropoxide (40 g). After that triethoxysilane (15 g) was added. Solution was refluxed for 4 hours. Solvent exchanged was performed to 1-propanol. The solution was filtrated with 0.04 μm filter to obtain process ready solution.

Example 8

Aluminium nitrate-nonahydrate (180 g) in water solution was mixed with Aluminium isopropoxide (20 g) and Titanium isopropoxide (25 g). After that triethoxysilane (15 g) was added. Solution was refluxed for 4 hours. Solvent exchanged was performed to 1-propanol. The solution was filtrated with 0.04 μm filter to obtain process ready solution.

Example 9

Aluminium nitrate-nonahydrate (180 g) in water solution was mixed with Titanium (IV) isopropoxide (38 g). After that triethoxysilane (15 g) was added. Solution was refluxed

Example 10

Aluminium nitrate-nonahydrate (180 g) in water solution was mixed with Aluminium isopropoxide (20 g) and Tantalum ethoxide (22 g). After that triethoxysilane (15 g) was added. Solution was refluxed for 4 hours. Solvent exchanged was performed to 1-propanol. The solution was filtrated with 0.1 μm filter to obtain process ready solution.

Example 11

Aluminium nitrate-nonahydrate (180 g) in water solution was mixed with Aluminium isopropoxide (35 g). After that tetraethyl orthosilicate (5 g) and triethoxysilane (14 g) was added. Solution was refluxed for 4 hours. Solvent exchanged was performed to 1-propanol. The solution was filtrated with 0.04 μm filter to obtain process ready solution.

Example 12

20 g of Aluminium s-butoxide and 200 g of PGEE were mixed for 30 min. 15.58 g of Ethyl Acetoacetate was added and followed by addition of triethoxysilane (11 g) was added and mixed. Mixture of $H_2O$ and PGEE (8 g and 40 g) was added. The solution was filtrated with 0.1 μm filter to obtain process ready solution.

Example 13

20 g of $AlCl_3$ was dissolved to EtOH (200 g) and $TiCl_4$ (10 g)+$Ti(iOPr)_4$ (14 g) was dissolved to 200 g of EtOH. Dissolved solutions were combined. Solution was stirred for 60 min at RT. Triethoxysilane (15 g) was added and solution was stirred at RT for 60 min. EtOH was distilled using membrane pump. 220 g of 2-isopropoxyethanol was added to the material flask. Solution was cooled down and filtrated. Solution was formulated to the final processing solvent 1-butanol and was filtrated with 0.1 μm filter to obtain process ready solution.

Example 14

Mg (8 g) was charged in reactor flask and the atmosphere was changed from air to $N_2$. Dry THF (175 ml) was added to Mg and $Cl_3SiCH_2Cl$ (35 mL) was added at RT. Solution was refluxed for 4 hours. The reaction mixture was washed with dry THF and $LiAlH_4$ was added (4.0 grams). The solution was refluxed for 2 hours. The solvent was changed to pentane and extracted (300-400 mL). The solution was filtrated and solvent exchange was made to propylene glycol propyl ether (PnP). Material was diluted to process formulation and filtrated with 0.1 μm filter to obtain process ready solution.

Example 15

Mg (12 g) was charged in a reactor flask and the atmosphere was changed from air to $N_2$. Dry THF was added to Mg and $Cl_3SiCH_2Cl$ (35 mL) was added at RT. CuCN was added to the reaction mixture. Solution was refluxed for 4 hours. The reaction mixture was washed with dry THF and $LiAlH_4$ was added (4.0 grams). The solution was refluxed for 2 hours. The solvent was changed to pentane and extracted (300-400 mL). The solution was filtrated and solvent exchange was made to propylene glycol propyl ether (PnP). The material was diluted to process formulation and filtrated with 0.1 μm filter to obtain process ready solution.

Example 16

Basic recipe: Place 704 grams of Titanium (IV) isopropoxide to reactor flask. Add 470 grams of titanium tetrachloride to reactor. Add 5760 ml of methanol to the reactor and stir the reaction solution for 2 hours.

MeOH was distilled using membrane pump, distillation apparatus and oil bath. 5872 grams of 2-isopropoxyethanol was added to the material flask. The solution was cooled down to −6° C. 1013 g of TEA was added the way that the material solution temperature was kept between −6° C. and +6° C. during TEA addition. The solution was filtrated using a Buchner funnel. The solution was cooled down in the reactor over night. Finally the solution was filtrated using a filter paper. The solution was formulated to the final processing solvent IPA and was ready for processing after final filtration.

Example 17

20 g of $AlCl_3$ was dissolved to 200 g of EtOH and $TiCl_4$ (9.48 g)+$Ti(iOPr)_4$ (14.21 g) was dissolved to 200 g of EtOH. Dissolved solutions were combined. Solution was stirred for 60 min at RT. EtOH was distilled using membrane pump, distillation apparatus and oil bath. 220 g of 2-isopropoxyethanol was added to the material flask. The solution was cooled down to 6° C. 101.18 g of TEA was added in 10 min. Material solution temperature was kept between 6° C. and +6° C. during TEA addition. The solution was filtrated using a Buchner funnel. The solution was placed to the freezer over night. Finally the solution was filtrated using a filter paper. The solution was formulated to the final processing solvent EtOH and was ready for processing after final filtration.

Example 18

20 g of Aluminium s-butoxide and 200 g of PGEE were weighted to a round bottom flask and stirred at room temperature for 30 min. 15.58 g of Ethyl Acetoacetate was added drop-wise to the solution and stirring at room temperature was continued further 1 h. Mixture of H2O/PGEE (8 g/40 g) was added to the clear solution dropwise by Pasteur pipette and solution was stirred at room temperature overnight. The solid content of the material is 4.49 w-%.

Example 19

To a round bottom flask containing 182.7 of ANN-DI water, 42.27 g of Aluminum-isopropoxide (AIP) power was added during 40 min under strong stirring. After AIP addition, 19.18 g of TEOS was added drop-wise during 30 min. The clear solution was stirred over a night at room temperature. Solution was heated up to 60° C. using an oil bath and condenser and stirred at 60° C. for 4 hours. After 4 hours clear solution was further stirred at room temperature for over a night.

Solvent exchange was carried out from DI water to 1-propanol using a rotary evaporator with three 1-propanol addition steps (Water bath temperature 60° C.). The total amount of added 1-propanol was 136 g. Total amount of removed solution was 195 g. After solvent exchange solid content of the solution was 16.85 w-%.

The invention claimed is:

1. A method of passivating a silicon substrate for use in a photovoltaic device, comprising
providing a p-type silicon substrate having a bulk and exhibiting a front surface and a rear surface;
forming by liquid phase application a dielectric layer on at least said rear surface;
wherein said dielectric layer is formed by polymerizing Al(iOPr)$_3$, Ti(iOPr)$_4$, and HSi(OR$^1$)$_3$, or Ti(iOPr)$_4$, HSi(OR$^1$)$_3$, and TiCl$_4$, or HSi(OR$^1$)$_3$, and Al(iOPr)$_3$, wherein R$^1$ is an alkyl group.

2. The method according to claim 1, wherein a dielectric, hydrogen releasing and anti-reflecting layer is formed also on the front surface and wherein said dielectric layer on the front surface releases hydrogen into the bulk of the substrate as well as on the front surface.

3. The method according to claim 1, wherein the dielectric layer has a thickness ranging from 5 to 250 nm.

4. The method according to claim 1, comprising additionally forming at the rear surface a layer of Al$_2$O$_3$ having a thickness in the range from 1 to 50 nm, said layer being formed by plasma-enhanced CVD, by sputtering, or by atomic layer deposition.

5. The method according to claim 4, wherein the Al$_2$O$_3$ layer is formed under the hydrogen-releasing layer, between the hydrogen releasing and passivating layer and the rear surface of the substrate.

6. The method according to claim 1, wherein the liquid phase coating is carried out by a method selected from dip coating, slot coating, roller coating and spray coating.

7. The method according to claim 1, wherein the silicon substrate is part of a photovoltaic cell.

8. The method according to claim 7, wherein the photovoltaic cell is part of a photovoltaic panel or module.

9. The method according to claim 1, wherein the silicon substrate is part of a photovoltaic cell and a photovoltaic cell array is laminated with cover glass with thickness ranging from 1 mm to 4 mm.

10. The method according to claim 9, wherein the photovoltaic cell array is laminated with cover glass that is anti-reflection coated to further improve the efficiency of the photovoltaic cell.

11. The method according to claim 1, wherein a photovoltaic cell is manufactured using only atmospheric pressure manufacturing processes.

* * * * *

UNITED STATES PATENT AND TRADEMARK OFFICE
CERTIFICATE OF CORRECTION

| | |
|---|---|
| PATENT NO. | : 10,693,021 B2 |
| APPLICATION NO. | : 14/430556 |
| DATED | : June 23, 2020 |
| INVENTOR(S) | : Ari Karkkainen et al. |

It is certified that error appears in the above-identified patent and that said Letters Patent is hereby corrected as shown below:

On the Title Page

Item (87) PCT Pub. Date "Mar. 7, 2014" should correctly appear as -- Mar. 27, 2014 --.

Signed and Sealed this
Eighth Day of December, 2020

Andrei Iancu
*Director of the United States Patent and Trademark Office*